United States Patent [19]

Yoshikawa et al.

[11] Patent Number: 5,691,668

[45] Date of Patent: Nov. 25, 1997

[54] FEEDFORWARD AMPLIFIER

[75] Inventors: Yoshishige Yoshikawa, Ibaraki; Hiroaki Kosugi, Hirakata; Hisashi Adachi, Minou; Kazuo Nagao; Shinichi Kugou, both of Yokohama, all of Japan

[73] Assignee: Matsushita Electric Industrial Co., Ltd., Osaka, Japan

[21] Appl. No.: 599,799

[22] Filed: Feb. 12, 1996

[30] Foreign Application Priority Data

Feb. 13, 1995 [JP] Japan .................................. 7-024127

[51] Int. Cl.⁶ .................................................. H03F 1/32
[52] U.S. Cl. ........................................ 330/151; 330/52
[58] Field of Search ............................ 330/52, 149, 151; 375/297; 455/63

[56] References Cited

U.S. PATENT DOCUMENTS 5,117,197  5/1992  Hsu et al. ........................ 330/151 X
5,444,418  8/1995  Mitzlaff ............................ 330/151 X
5,477,187  12/1995 Kobayashi et al. ................ 330/151 X Primary Examiner—James B. Mullins
Attorney, Agent, or Firm—Ratner & Prestia

[57] ABSTRACT

A feedforward amplifier comprises a first feedforward circuit and a second feedforward circuit. The first feedforward circuit detects the distortion component of the output of a main amplifier through a first distortion detection circuit, and inserts the detected distortion component into the output signal of the main amplifier in a first distortion cancellation circuit to cancel the distortion component. The second feedforward circuit detects the distortion component of the output of the first feedforward circuit through a second distortion detection circuit, and inserts the detected distortion component into the output signal of the first feedforward circuit in a second distortion cancellation circuit, to perform distortion cancellation over a wide range of frequencies.

7 Claims, 11 Drawing Sheets

FEEDFORWARD AMPLIFIER

FIELD OF THE INVENTION

This invention relates generally to a high power linear amplifier used for amplifying multi-channel signals in high frequency bands, and in particular to a feedforward amplifier, in which non-linear distortion introduced by the main amplifier is extracted and removed.

BACKGROUND OF THE INVENTION

A feedforward amplifier is an apparatus used in a transmitter of a base station of portable radio telephone systems, radio paging systems, etc.

In a portable radio telephone system, the base station transmits a signal through a plurality of channels. In a radio paging system, a base station also transmits the signal through a plurality of channels at the same time. For example, in a typical digital portable radio telephone system, a base station transmits the signal through 32 channels at the same time. In this case, separate amplification of each of the channels will not be acceptable, due to the excess cost and space required for a channel combiner necessary to combine the channels after amplification. Therefore, the transmitter is preferably provided with a common amplifying system in which the signals in all the channels are amplified together.

In a common amplifying system, however, a spurious signal produced by the inter-modulation of the signals of many channels due to the nonlinearity of the amplifier presents a problem. The radio wave regulation of Japan specifies the upper limit of the strength of the spurious signal; 60 dB lower than the channel signal strength for a base station of the portable radio telephone system, and 70 dB lower for a base station of the radio paging system which has higher power. Usually, the strength of the spurious signal produced by common amplification in a high power transistor device is about 30 dB weaker than the signal strength. This is far from meeting the regulation, necessitating some measure to reduce the strength of the spurious signal an additional 30 to 40 dB. Thus, distortion cancellation by feedforward techniques has been adopted.

An explanation of a conventional signal suppression circuit and a feedforward amplifier is provided below with reference to FIGS. 8–11.

Referring FIG. 8, a signal suppression circuit comprises an input terminal 101, an output terminal 102, a power divider 103, a power combiner 104, and a phase inverter 105. A signal inputted at the input terminal 101 is divided to two parts by the power divider 103. One of the divided signals has its phase inverted 180° by the phase inverter 105. The non-inverted signal and the inverted signal are combined by the power combiner 104. The power combiner may be implemented using a transformer, but for high frequency signals, a directional coupler and a microstrip line may be used. There will be no output signal at output terminal 102 because both the signals have the same magnitude but opposite phase and cancel each other out.

Referring to FIG. 9, a prior an feedforward amplifier comprises a distortion detection circuit 124 and distortion cancellation circuit 125. The distortion detection circuit 124 comprises a power divider 113 with ports a, b and c, and a power combiner 114 with two input ports d and e and two output ports f and g. Ports b and d are connected by an amplitude control 118, a phase control 120, and a main amplifier 116 in series. Port c and the port e are connected by a delay line 122. Port a is connected to the input terminal 111 of the system. The distortion cancellation circuit 125 comprises a power combiner 114, in common with the first distortion detection circuit 124, and a power combiner 115 with two input ports h and i and an output port j connected to the output terminal 112 circuit. Connected between the ports f and h is a delay line 123. Between the ports g and i are another amplitude control 119, another phase control 121 and an auxiliary amplifier 117 connected in series. The input signal to the input terminal 111 is divided into two parts by the power divider 113. One of the divided signals passes through the amplitude control 118 and the phase control 120, and is amplified by the main amplifier 116 and inputted into the power combiner 114 at port d. Another part of the signal is transmitted from port c to the power combiner at port e through the delay line 122. The circuit is arranged so as to have the input signals at the port d and the port e cancel each other out. That is, the degree of combination between the ports d–g and the ports e–g of the power combiner 114 is arranged appropriately, and the amplitude and phase of the signal inputted at the port d are adjusted by the amplitude control 118 and phase control 120 so that the signal at port d and the signal at port e have the same magnitude but opposite phases. If the adjustment is complete, no signal is outputted from the port g.

However, the signal outputted from the main amplifier 116 and inputted to the power combiner 114 at the port d includes a distortion component in addition to the amplified component of the multiple input signals. The distortion component is due to inter-modulation resulting from non-linearity. The signal inputted at the port e has no distortion component. As a result, when the two signals are combined at the power combiner 114, normal input signal components are canceled to output only the distortion element from the port g. If the coupling between the ports d and f is approximately 1 and the coupling between the ports d and g is sufficiently low, then the majority of the normal input signal and the distortion component outputted by the main amplifier 116 are outputted at the port f.

In the distortion cancellation circuit 125, the signal outputted from the port f of the power combiner 114 consisting of the input normal signal and the distorted component is inputted to the port h of the power combiner 115 through the delay line 123. The distortion element outputted from the port g is transmitted to the port i of the power combiner 115 via the amplitude control 119, the phase control 121 and the auxiliary amplifier 117. If the coupling between the ports h and j and between i and j of the power combiner 115 are appropriately set and the amplitude control 119 and the phase control 121 are suitably adjusted, the distortion components inputted at the ports h and i have the same amplitude and opposite phases and thus cancel each other out. The combiner 115 outputs the normal input signal with minimal distortion. Also, if, in the power combiner 115, the coupling between the ports h and j is approximately one and the coupling between the ports i and j is sufficiently low, the input signal element inputted into the port h is primarily outputted from the port j. Thus, by optimally setting of the distortion detection circuit 124 and the distortion cancellation circuit 125, the inter-modulation distortion introduced by the main amplifier 116 is canceled. However, in the above described feedforward amplifier, the cancellation of the distortion over a wide frequency range is difficult to realize due to the difficulty in adjusting the individual components.

In addition, a phase inverter with a wide frequency range is difficult to realize. For example, a half wave microstrip line as shown in FIG. 10 may be used to form a phase inverter in the signal suppression circuit. The frequency characteristics of the signal suppression circuit are shown in FIG. 11, in which the ordinate shows the signal suppression and the abscissa indicates the frequency normalized by the center frequency. As shown in FIG. 11, more than 60 dB of signal suppression is obtained at the center frequency. However, the relative frequency bandwidth having a signal suppression larger than 30 dB is 2.0%, and, if suppression of more than 40 dB is required, the band width is narrowed to only 0.6%. To obtain phase inversion for a wide frequency range various other methods are possible. Providing a power divider and power combiner with a directional coupler to realize a 90° phase difference each results in a 180° phase difference. A circulator having one terminal short-circuited also realizes phase inversion. Practically, however, phase inversion for a wide frequency range is difficult, in spite of the frequency independence in principle.

Moreover, the main amplifier and the auxiliary amplifier in the feedforward amplifier in FIG. 9 have gain and phase characteristics which depend upon frequency and which, further change with temperature, so that the distortion cancellation is even more difficult.

SUMMARY OF THE INVENTION

It is an object of the present invention to provide a feedforward amplifier which provides distortion cancellation over a wide frequency range.

To obtain the above object a feedforward amplifier according to the present invention comprises a first feedforward circuit and a second feedforward circuit. The first feedforward circuit includes a first distortion detection circuit and a first distortion cancellation circuit. The first distortion detection circuit detects the distortion in the output of a main amplifier. The first distortion cancellation circuit cancels the detected distortion by amplifying the distortion by a first auxiliary amplifier and combining the amplified distortion with the output of the main amplifier. The second feedforward circuit comprises a second distortion detection circuit and a second distortion cancellation circuit. The second distortion detection circuit detects the distortion of the output of the first feedforward circuit. The second distortion cancellation circuit cancels the detected distortion by amplifying it by a second auxiliary amplifier and combining it with the output of the first feedforward circuit.

DESCRIPTION OF THE PREFERRED EMBODIMENT

Figure 1:
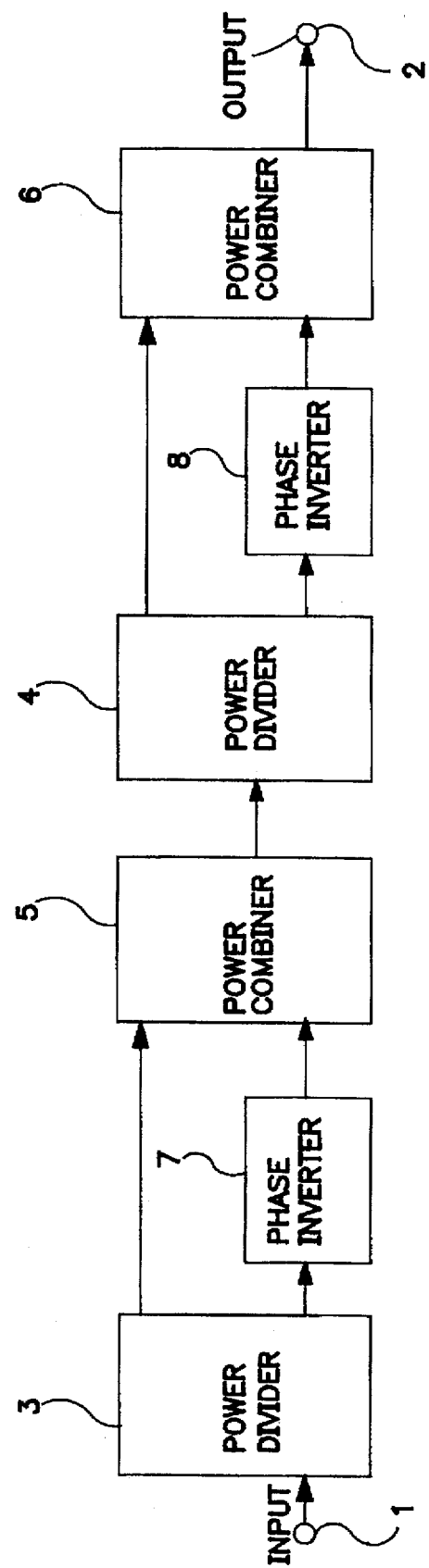
FIG. 1 is a block diagram of a signal suppression circuit showing the principle of distortion suppression according to the present invention.
Figure 8:
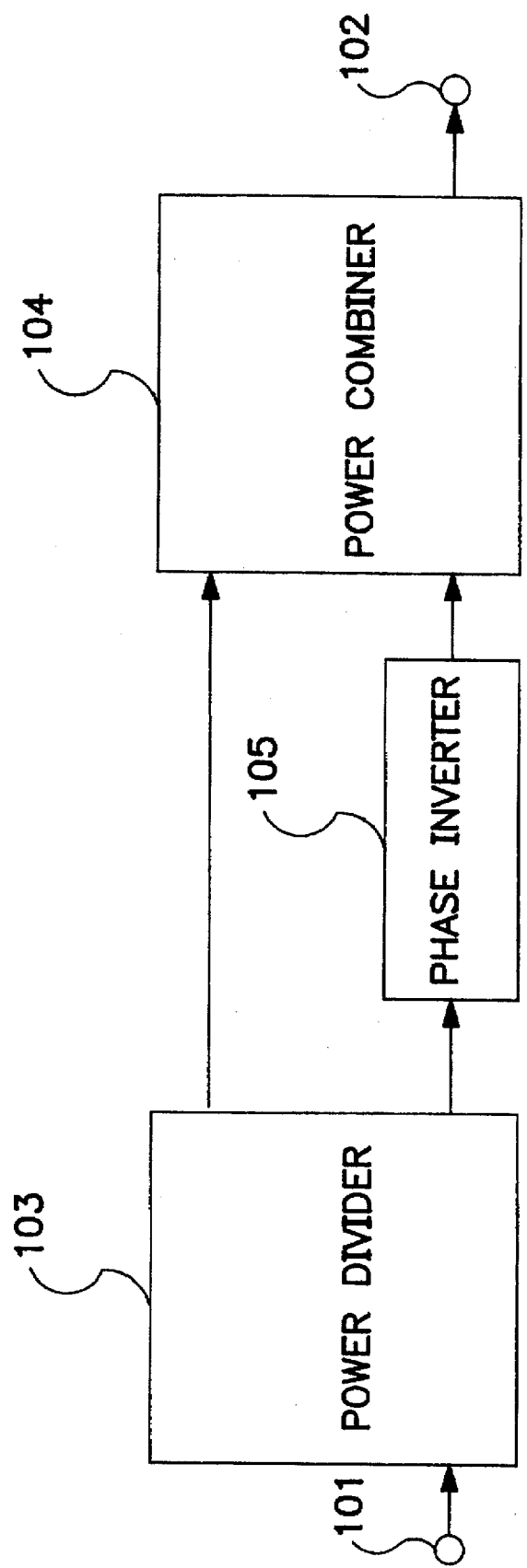
FIG. 8 is a block diagram of a prior art signal suppression circuit.

Referring to FIG. 1, the signal suppression circuit according to the present invention comprises an input terminal 1, an output terminal 2, power dividers 3 and 4, power combiners 5 and 6, and phase inverters 7 and 8. The suppression circuit consists of two signal suppression circuits shown in FIG. 8 connected in series. In the circuit shown in FIG. 1, distortion suppression is performed in both stages independently, and the suppression effect of whole the circuit is obtained as the product.

Figure 2:
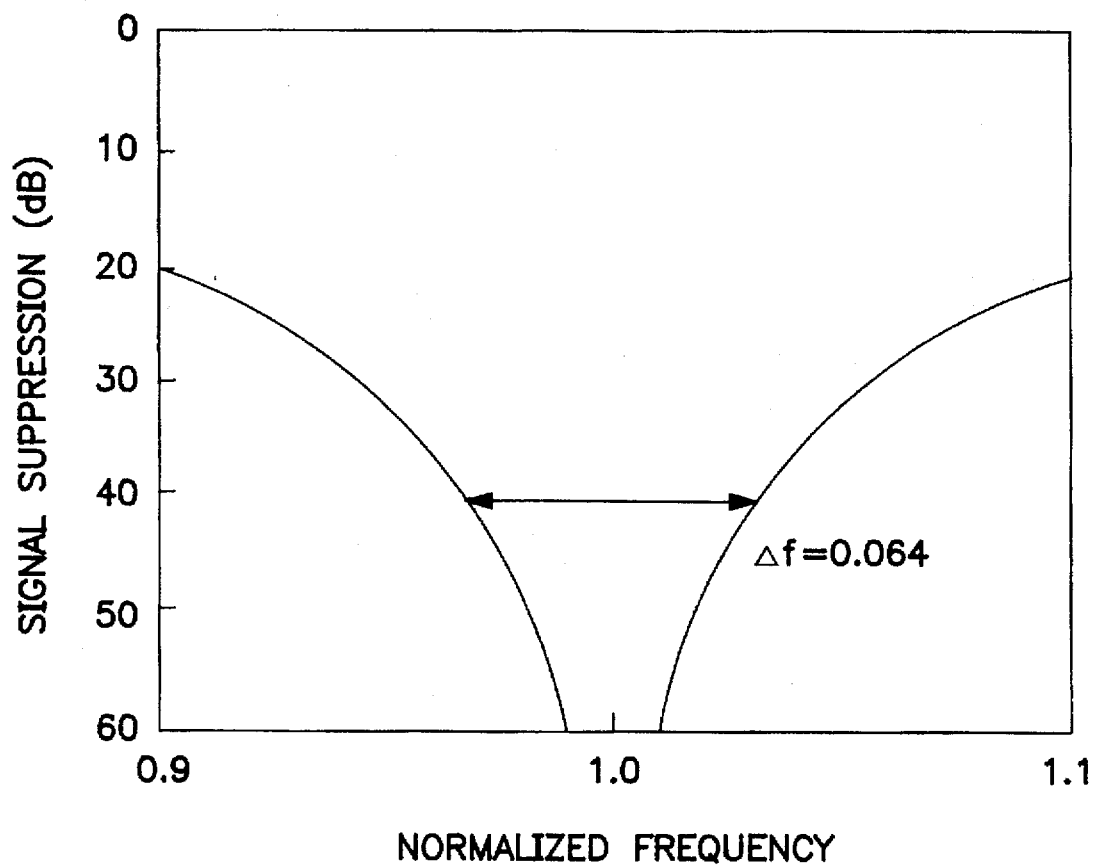
FIG. 2 is a graph of the frequency characteristics of the distortion suppression circuit of FIG. 1.
Figure 11:
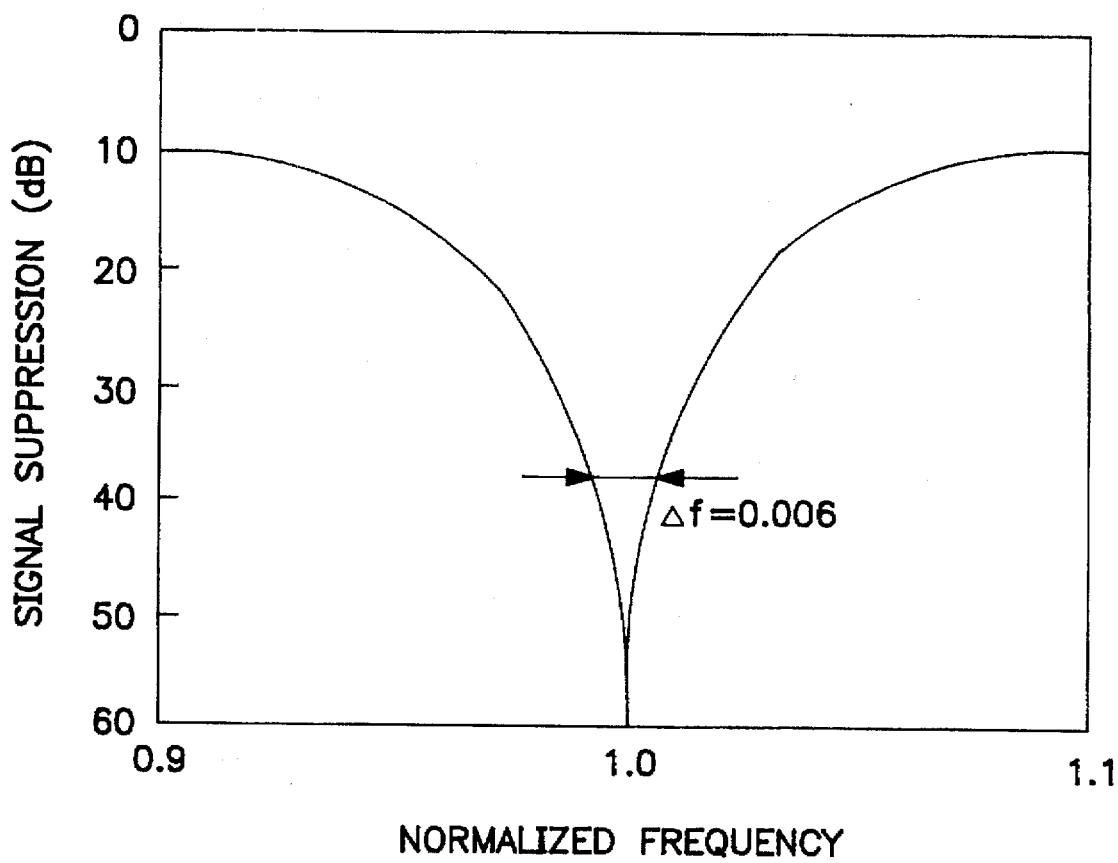
FIG. 11 is a graph of the frequency characteristics of the signal suppression circuit of the prior art.

FIG. 2 illustrates frequency characteristics of the signal suppression circuit of FIG. 1. The phase inverters 7 and 8 were formed of the same half-wave length lines. Compared to FIG. 11, widening of the signal suppression band is significant. For the 40 dB band, suppression is 0.6% in the prior art FIG. 11 compared to 6.4% in FIG. 2.

Figure 3:
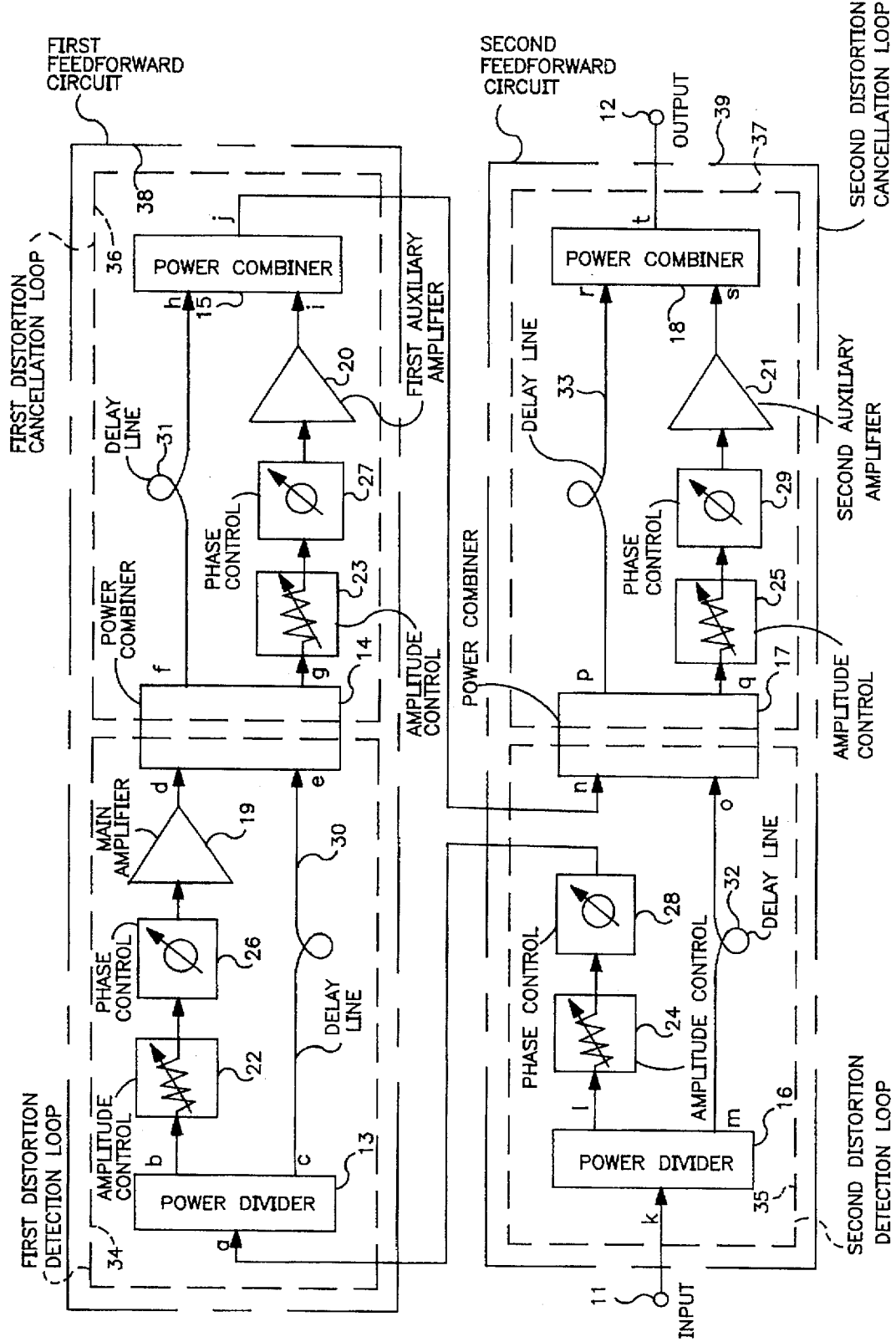
FIG. 3 is a block diagram of a circuit related to a first and a second embodiments of the feedforward amplifier according to the present invention.

Referring to FIG. 3, a feedforward amplifier embodying the present invention consists of a first feedforward circuit 38 and a second feedforward circuit 39. The first feedforward circuit 38 consists of a first distortion detection circuit 34 and a first distortion cancellation circuit 36. The first distortion detection circuit 34 consists of a power divider 13 with ports a, b, and c, and a power combiner 14 with ports d, e, f, and g. An amplitude control 22, a phase control 26 and a main amplifier 19 are connected in series between the port b and d. Delay line 30 is connected between the ports c and e. The first distortion cancellation circuit 36 comprises the power combiner 14, which is also a component in the first distortion detection circuit 34, and another power combiner 15 with ports h, i, and j. An amplitude control 23, a phase control 27 and a first auxiliary amplifier 20 are connected in series between the ports g and i. A delay line 31 connects the ports f and h.

The second feedforward circuit 39 consists of a second distortion detection circuit 35 and a second distortion cancellation circuit 37 having an input terminal 11 and output terminal 12 respectively. The second distortion detection circuit 35 consists of a power divider 16 with ports k, 1 and m, and a power combiner 17 with ports n, o, p, and q. An amplitude control 24 and a phase control 28 are connected in series, and a delay line 32 connects the ports m and o. The port 1 of the divider 16 and the port n of the combiner 17 are connected in series with the amplitude control 24, the phase control 28, and the first feedforward amplifier 38. The phase control 28 is connected to the port a, and the port j of the power combiner 15 is connected to the port n of the combiner 17. The port m and the port o are connected by a delay line 32. The second distortion cancellation circuit 37 includes power combiner 17 commonly with the second distortion detection circuit 35 and a power combiner 18 with ports r, s and t. A delay line 33 connects the ports p and r. A series connected amplitude control 25, phase control 29 and a second auxiliary amplifier 21 connect the ports q and s.

Figure 9:
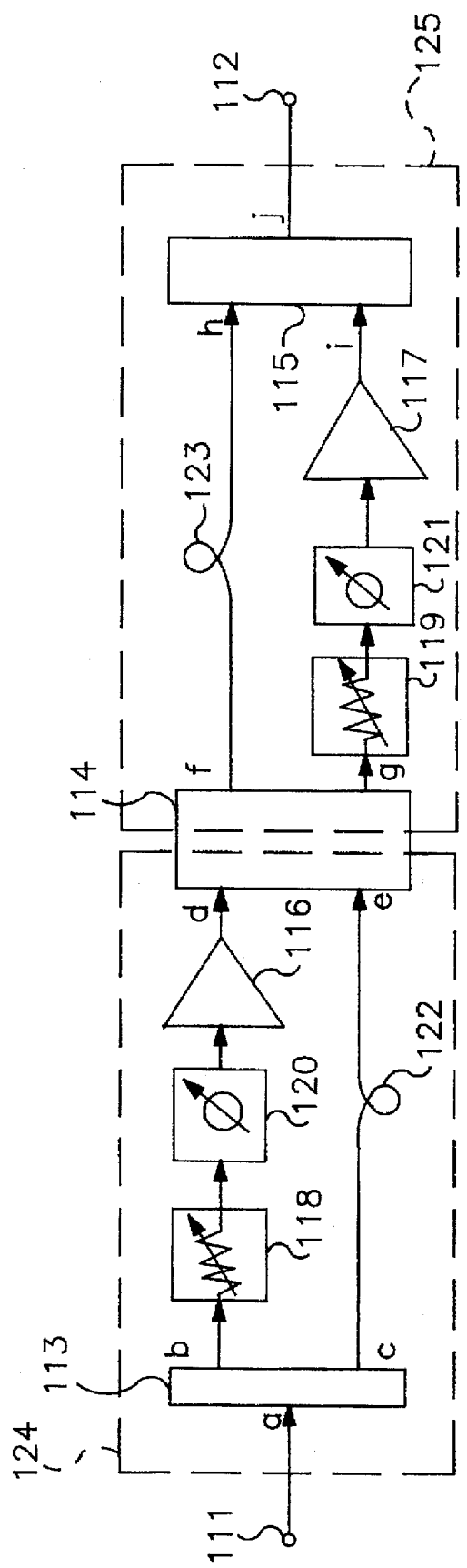
FIG. 9 is a block diagram of a prior art feedback amplifier.
Figure 10:
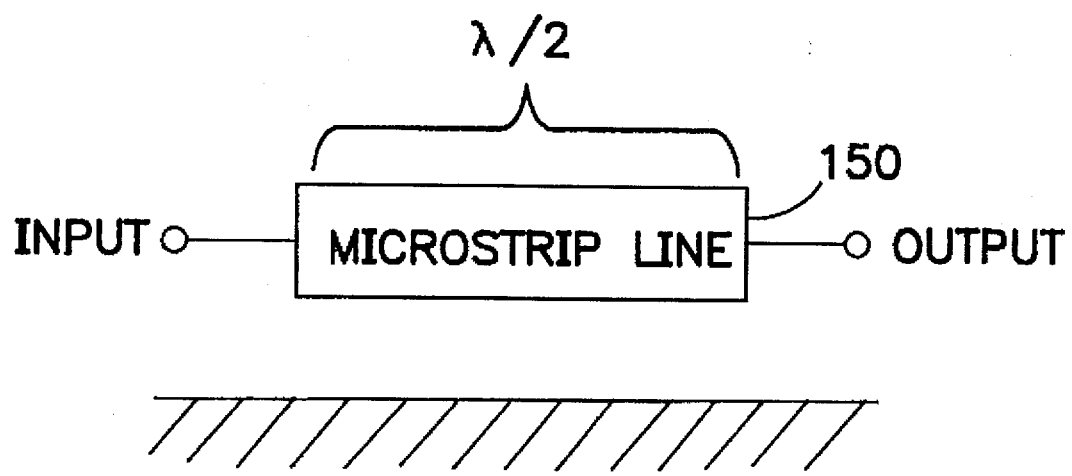
FIG. 10 is a block diagram of a prior art phase inverter.

When a signal including multi-channel components is inputted at the terminal 11, it is divided by the power divider 16 to two parts. One of the two parts is transferred, through the amplitude control 24 and the phase control 28 to the first feedforward circuit 38. The function of the first feedforward circuit is the same as that of the feedforward amplifier of FIG. 9 explained above. The distortion produced in the main amplifier 19 is suppressed by the first feedforward circuit 38. However, for reasons already described, the band width having sufficient suppression of distortion is limited, and the feedforward circuit 38 outputs not only the normal signal but stone distortion elements, necessitating further distortion cancellation to achieve wider range distortionless amplification. Thus, the output from the port j of the power combiner 15 is inputted to the port n of the power combiner 17. The part of the signal previously divided by the power divider 16 and outputted through the port m is transferred to port o of the power combiner 17 via the delay line 32. The input to the port n includes the normal signal and the remaining distortion elements, while the input to the port o consists of the normal input signal only. By appropriately setting the coupling between the ports n and q and between the ports o and q of the power combiner 17, and adjusting the amplitude control 24 and the phase control 28, the inputs signal to the port n and to the port o can be added with the same amplitude but with 180° different phase angles. This results in the output at the port q of a signal consisting mainly of the distorted components, the normal signal element being weak.

If the coupling between the ports n and p is approximately one, and the coupling between the ports n and q is sufficiently low, the majority of the input to the port n will be outputted from the port p.

The output from the port q (mainly the distorted component) is transferred to the port s of the power combiner 18 via the amplitude control 25, phase control 29, and auxiliary amplifier 21, where it is amplified. While the output from the port p (the normal signal and the distortion component) is inputted to the port r of the power combiner 18 through the delay line 33. By suitably setting the coupling of the power combiner between the ports r and t and between the ports s and t and adjusting the amplitude control 25 and the phase control 29, the distortion components to the port r and to the port s have the same amplitude but 180° phase differences. This produces an output signal with the distortion components sufficiently canceled and suppressed, that is, the normal signal amplified. If the coupling of the ports r and t is approximately one and the coupling between the ports t and s is made sufficiently low, the majority of the input to the port r will be outputted from the port t.

The distortion cancellation of the whole feedforward amplifier is obtained as the multiplication of the distortion suppressions of the two feedforward amplifiers, so that the above explained amplifier has a distortion cancellation characteristic over a wider frequency range.

A second embodiment of the invention will be now described. Distortion cancellation over the frequency range which is wider than that obtained by the amplifier of the first embodiment is obtained by making the center frequencies of the first and the second feedforward amplifier different from each other. The center frequencies are frequencies at which the distortion cancellation is performed.

Figure 4:
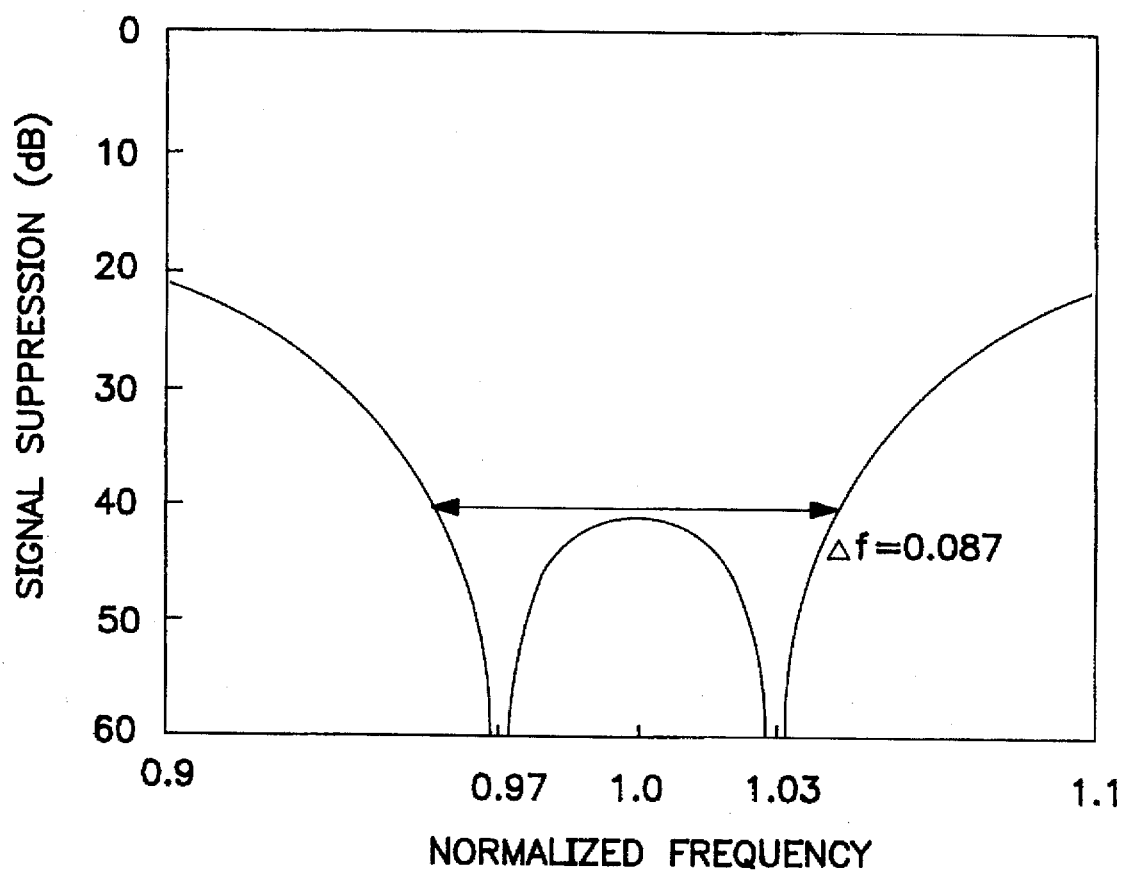
FIG. 4 is a graph of the frequency characteristics of signal suppression obtained by modifying the circuit of FIG. 1.

If, in the signal suppression circuit in FIG. 1, the phase inverter 7 is formed of a half-wave length line at 0.97 normal frequency, and the phase inverter 8 is formed of a half-wave length line at 1.03 normal frequency, the frequency characteristic of the signal suppression circuit is shown in FIG. 4. The frequency range to realize signal suppression of more than 40 dB is 8.7% in FIG. 4 versus 6.4% in FIG. 2.

The circuit of the second embodiment can cope with a wide frequency range for the amplification of a multichannel signal. It also compensates for a main amplifier having inferior characteristics, where the distortion due to inter-modulation in common amplification includes not only the third harmonic but also fifth, seventh etc. requiring the distortion suppression frequency range to be much wider than the channel band. Further, it is not necessary externally to control the circuit even if a distortion cancellation circuit has experienced some shift caused by a characteristic change of the auxiliary amplifier due to temperature change, because it provides distortion suppression over a wide range to accommodate the shift.

Figure 5:
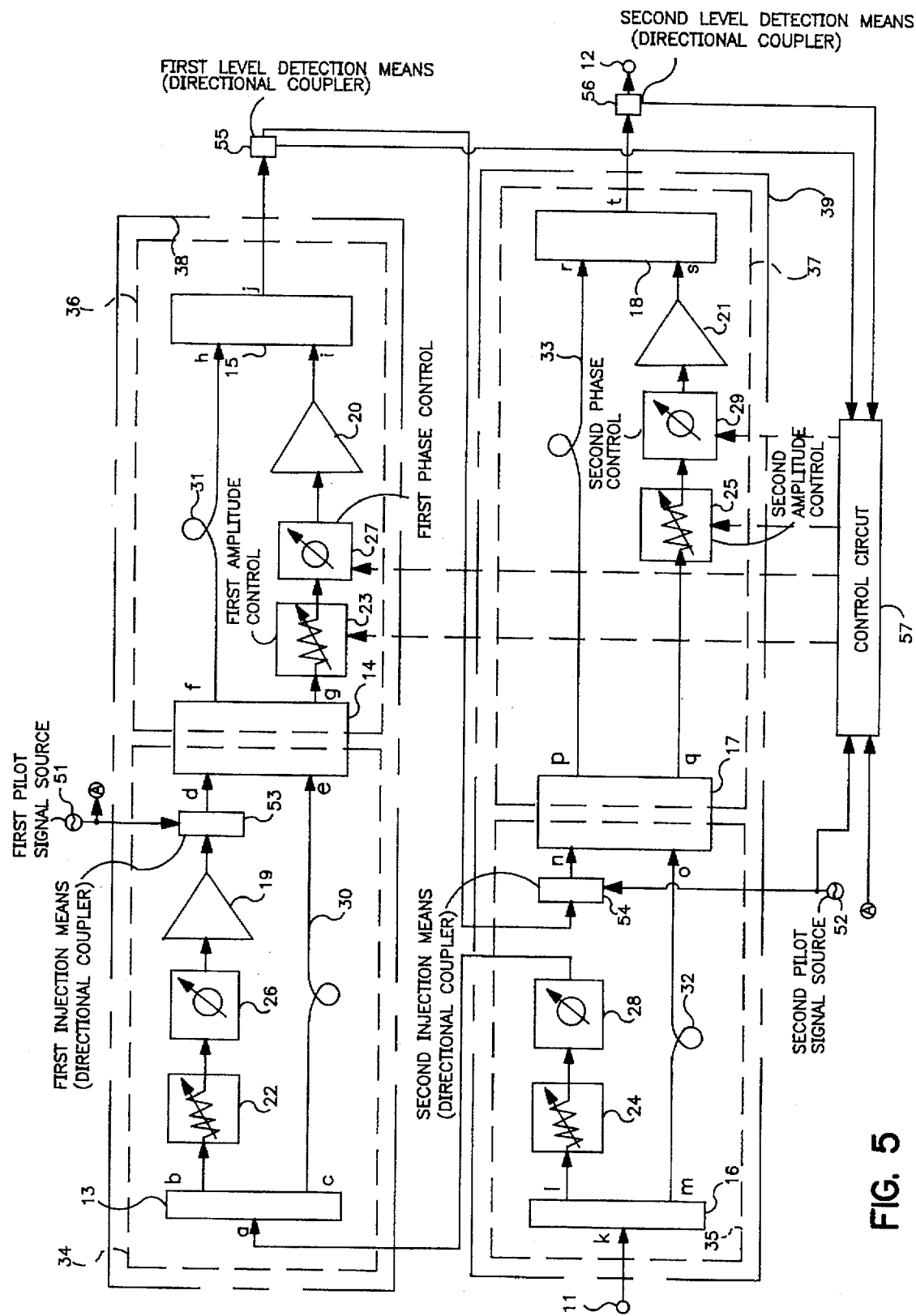
FIG. 5 is a block diagram of a third embodiment of a feedforward amplifier of the present invention.

Referring to FIG. 5, a third embodiment of the present invention is explained. A feedforward amplifier comprises some parts having the same reference number and same function as in the previous embodiments. In addition, the feed forward amplifier includes a first pilot signal source 51 and a second pilot signal source 52, a directional coupler or a first inserting device 53, another directional coupler or a second inserting device 54, another directional coupler or a first level detector 55, another directional coupler or a second level detector 56, and a control circuit 57. The fundamental structure is the same as in the first and second embodiments. The third embodiment differs in that two pilot signals are inserted into the circuits to control the circuits by monitoring the pilot signals. The amplifier of the present embodiment provides distortion cancellation of more than 40 dB, whereas the amplifier of the first embodiment it was limited up to 30 dB only.

In the feedforward amplifier shown in FIG. 5, a pilot signal 51 is provided to the first inserting device 53 which is positioned at the output side of the main amplifier 19. Another pilot signal 52 is provided to the second inserting device 54 which is placed at the output side of the first level detector 55.

The first level detector 55, placed at the output sides of the first feedforward circuit 38, provides a signal to the control circuit 57. Likewise, the second level detector 56, placed at the output side of the second feedforward circuit 39, provides a signal to the control circuit 57. The control circuit 57 monitors, in the signal from the coupler 55, the component from the pilot signal source 51, and controls the amplitude control 23 and phase control 27 so as to make the level of the pilot signal component minimum. Also, the control circuit 57 monitors, in the signal from the coupler 56, the component from the pilot signal source 52, and controls the amplitude control 25 and phase control 29 so as to make the level of the pilot signal component minimum. By including the above described controls constantly or intermittently, the first and second distortion cancellation circuits produce optimum results. For example, if, due to a temperature change etc., the gain or the phase shift is changed, the distortion cancellation can be maintained at an optimal state.

Figure 6A:
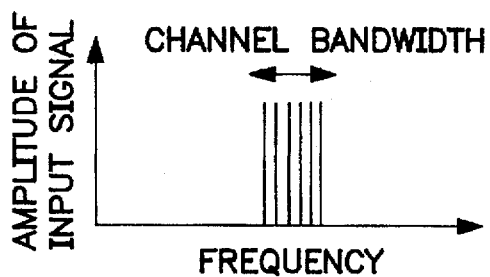
FIGS. 6(a)–6(e) illustrate the distortion cancellation effect of the third embodiment of the present invention.
Figure 6B:
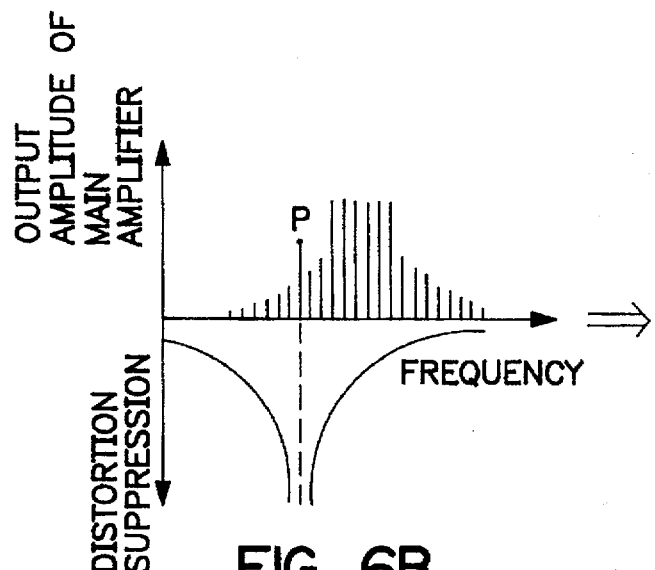

If the two pilot signals have different frequencies, the amplifier has advantages as described below. FIG. 6(a) is an example of the spectrum of an input signal combined with six channels. If the first and second feedforward circuits in FIG. 5 have the same center-frequency, the spectrum of the output of the main amplifier 19 is shown at the upper part in FIG. 6(b). The lower part of FIG. 6(b) shows the frequency characteristic of distortion suppression of a feedforward circuit.

Figure 6C:
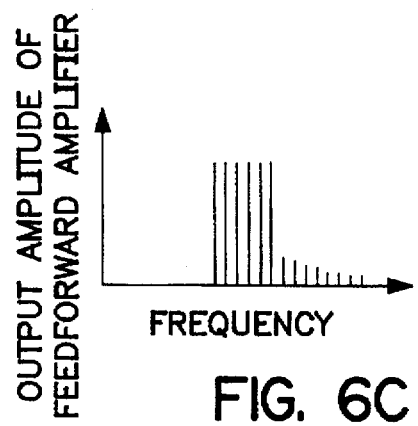

To effectively control the distortion cancellation circuit, the frequencies of the pilot signals must be suitably selected. In a digital portable radio telephone system with the channel frequency of 1.5 Hz, the channel interval is a minimum of 50 kHz. If the pilot signal is inserted in this interval, the detection of the pilot signal is difficult because detection must be performed in a very narrow band. Thus, a pilot signal outside of the channel band is considered. The point P in the upper part of FIG. 6(b) indicates the pilot signal component. The control of the distortion cancellation circuit is performed so as to minimize the pilot signal component. The distortion suppression is performed around the pilot signal frequency, as shown at the lower side of FIG. 6(b). FIG. 6(c) shows the output spectrum of the feedforward amplifier with an unsymmetric distortion suppression characteristic, leaving a distortion component on the higher frequency side.

Figure 6D:
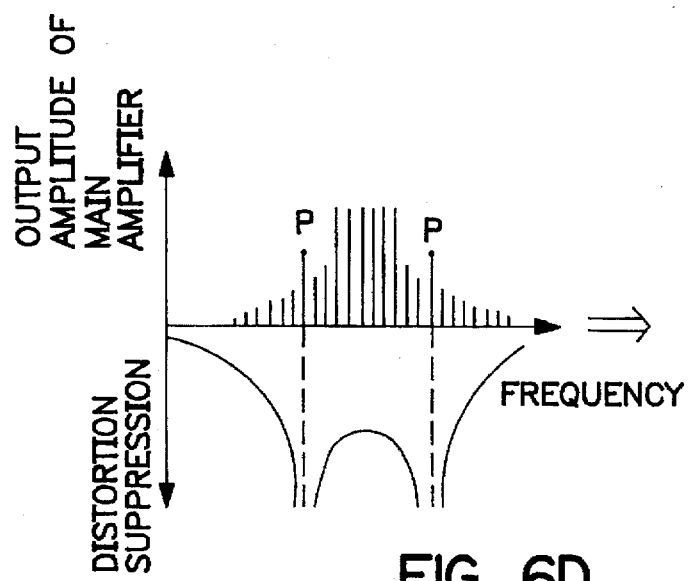
Figure 6E:
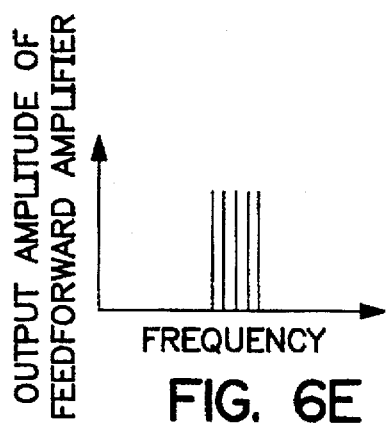

The upper portion of FIG. 6(d) illustrates the spectrum for the output amplitude of the main amplifier with two pilot signals on either side of the channel band. The lower portion of FIG. 6(d) shows the distortion suppression characteristic. The output spectrum for the feedforward amplifier is shown in FIG. 6(e). The distortion suppression is made symmetrically and over a wide range in the channel band.

In the third embodiment, a pilot signal is provided on both sides of the channel band to control the first and second distortion cancellation circuit independently. Distortion cancellation symmetric to the channel band is obtained and maintained even if the operation of the distortion cancellation circuit is changed due to the characteristic change of the auxiliary amplifier due to temperature changes.

Figure 7:
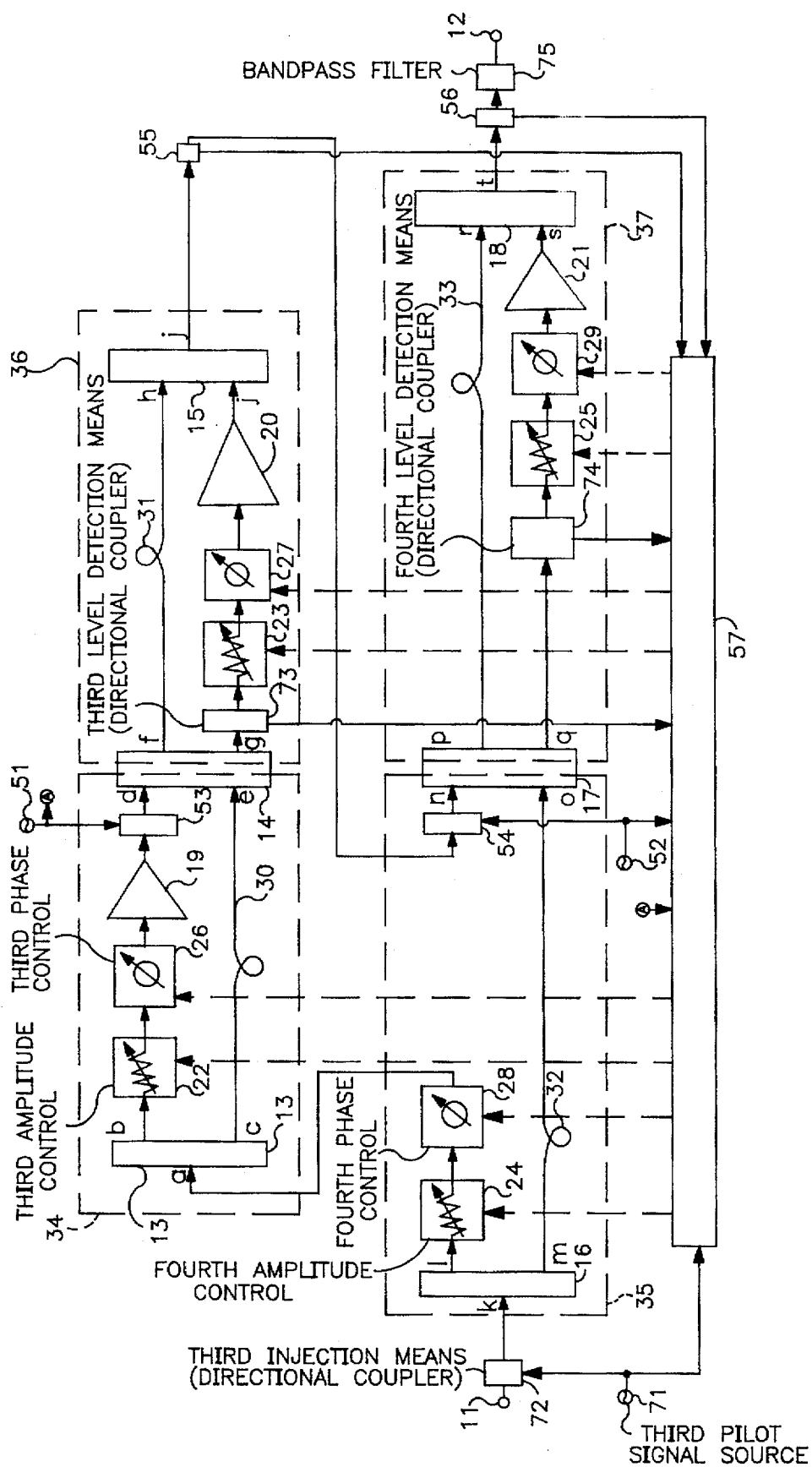
FIG. 7 is a block diagram of a fourth embodiment of the feedforward amplifier according to the present invention.

Now, referring to FIG. 7, a fourth embodiment of the feedforward amplifier according to the present invention is explained. Most of the elements of the amplifier in FIG. 7 are the same as those in the amplifiers previously explained and are given the same reference numerals. The amplifier of FIG. 7 also includes a third pilot signal source 71, a directional coupler or a third inserting device 72, another directional coupler or a third level detector means 73, and another directional coupler or a fourth level detector means 74, and a bandpass filter 75.

It was described in the above explanation of the third embodiment, that a stable distortion cancellation of the main amplifier is achieved through optimal control of the distortion cancellation circuit. However, the distortion detection circuit also has a band width which is of the same magnitude as that of the distortion cancellation circuit. The normal signal component in the output of the main amplifier exists in the channel band width. However, the distortion elements cover a frequency width three to five times that of the channel width, because they are generated by intermodulation. Therefore, the band width for the distortion detection circuit does not need to be as wide as that of the distortion cancellation circuit. However, for obtaining distortion-cancellation over a wide frequency range, control of the distortion detection circuit is necessary, since the characteristics of the main amplifier change due to temperature change, etc.

Referring to FIG. 7, if the distortion detection circuit does not optimally operate, normal signal elements of some strength will be output by port g or port q. This causes additional distortions to be produced in the auxiliary amplifier 20 or 21, resulting in the worsening of the distortion suppression characteristics of the feedforward amplifier. Therefore, the first and second distortion detection circuits are required to suppress the normal signal element so that the first and second auxiliary amplifiers have no distortions. Therefore, the amplifier control and phase control are adjusted continuously or intermittently to maintain the function of the distortion detection circuits optimum.

Referring to FIG. 7, the control of the distortion cancellation circuits 36 and 37 is the same as in the third embodiment described above. The control of the distortion detection circuits 34 and 35 is described below. A pilot signal from pilot signal source 71 is inserted through the third inserting device 72. The frequency of the pilot signal of the source 71 is different from the frequencies of the pilot signal source 51 and pilot signal source 52.

The control of the first distortion detection circuit 34 is performed by extracting the pilot signal of the pilot signal source 71 with the third level detector means 73, monitoring it with the control circuit 57, and adjusting the amplitude control 22 and the phase control 26 so as to keep the pilot signal level minimum. Also, the control of the second distortion detection circuit 35 is carried out by extracting the pilot signal of the pilot signal source 71 with the fourth level detector 74, monitoring it with the control circuit 57, and adjusting the amplitude control 24 and the phase control 28 to keep the pilot signal level minimum.

Distortion cancellation of the feedforward amplifier is maintained at an optimal state, by controlling the distortion cancellation circuit as explained in the third embodiment and the distortion detection circuit continuously or intermittently. A bandpass filter 75 is placed before the output terminal 12. Bandpass filter 75 removes the pilot signals from the pilot signal source 71 outside of the normal channel band and passes the channel band with little loss.

If the pilot signal is in the frequency band of the channel, a further measure is taken to have the pilot signal removed, such as adding an additional suppression circuit.

In the above embodiment, instead of inserting a pilot signal from the pilot signal source 71, one of the channel signals in the inputted normal signal can be used to control the distortion detection circuit. Also, the first and second detection circuits can be monitored using two pilot signals of different frequencies and two different center frequencies.

The present invention can be embodied in various forms, without departing frown the spirit or the main feature.

The aforedescribed embodiments are only examples and not to be understood limitedly. The scope of the present invention is shown by the claims, and not to be restricted by the above explanation. Modifications or changes in the scope of the claims or equivalents thereto are all within the scope of the invention.

What is claimed:

1. A feedforward amplifier comprising:
    a first feedforward circuit and a second feedforward circuit;
    said first feedforward circuit comprising
        a first distortion detection circuit and a first distortion cancellation circuit operating at a first frequency, said first distortion detection circuit detecting distortion in the output of a main amplifier, said first distortion cancellation circuit canceling the detected distortion by amplifying the detected distortion by a first auxiliary amplifier and inserting the amplified detected distortion into the output of said main amplifier;
    said second feed forward circuit comprising
        a second distortion detection circuit and a second distortion cancellation circuit operating at a second frequency, said second distortion detection circuit detecting distortion in the output of said first feedforward circuit, said second distortion cancellation circuit canceling the detected distortion by amplifying the detected distortion by a second auxiliary amplifier and inserting the amplified detected distortion into the output of said first feedforward circuit, wherein said first frequency and said second frequency are different from each other.

2. A feedforward amplifier according to claim 1, wherein said first frequency and said second frequency are arranged symmetrically about a center frequency of an input frequency band.

3. A feedforward amplifier according to claim 1, further comprising:

a first amplitude control and a first phase control placed in said first distortion cancellation circuit and a second amplitude control and a second phase control in said second distortion cancellation circuit, a first inserting means to insert a first pilot signal of said first frequency into the output signal of said main amplifier, a second inserting means to insert a second pilot signal of said second frequency into the output signal of said first feedforward circuit, a first level detection means coupled to said first feedforward circuit to detect said first pilot signal, a second level detection means coupled to said second feedforward circuit to detect said second pilot signal, and a control circuit, to control said first amplitude control and said first phase control so as to make the detection level of said first detection means a minimum, and to control said second amplitude control and said second phase control so as to make the detection level of said second detection means a minimum.

4. A feedforward amplifier according to claim 3, further comprising:

a third amplitude control and a third phase control in said first distortion detection circuit, a fourth amplitude control and a fourth phase control in said second distortion detection circuit, a third inserting means to insert into an input signal a third pilot signal having frequency which is different from said first and second frequencies and is outside the frequency band of said input signal, a third level detection means in said first distortion cancellation circuit to detect said third pilot signal, a fourth level detection means in said second distortion cancellation circuit to detect said third pilot signal, the control circuit to control said third amplitude control and said third phase control so as to make the detection level of said third level detection means a minimum and to control said fourth amplitude control and said fourth phase control so as to make the detection level of said fourth level detection means a minimum, and a band pass filter coupled to said second level detection means to pass said input signal and remove said third pilot signal.

5. A feedforward amplifier for use with an input signal comprising:

a first feedforward circuit and a second feedforward circuit;

a) said first feedforward circuit comprising a first distortion detection circuit and a first distortion cancellation circuit operating at a first frequency, said first distortion detection circuit having a first input port and detecting distortion in the output of a main amplifier, said first distortion cancellation circuit canceling the detected distortion by amplifying the detected distortion by a first auxiliary amplifier and inserting the amplified detected distortion into the output of said main amplifier;

b) said second feedforward circuit comprising a second distortion detection circuit and a second distortion cancellation circuit operating at a second frequency, a power combiner included commonly with said second distortion detection circuit and said second distortion cancellation circuit, said second distortion detection circuit comprising
second input port,
said first feedforward circuit having an output coupled to an input of said power combiner, said second distortion detection circuit detecting distortion in the output of said first feedforward circuit, said second distortion cancellation circuit canceling the detected distortion by amplifying the detected distortion by a second auxiliary amplifier and inserting the amplified detected distortion into the output of said first feedforward circuit, wherein said input signal is input to said second input port, an output of said second distortion detection circuit coupled to said first input port of said first distortion detection circuit and providing a portion of said input signal to said first distortion detection circuit, and said first frequency and said second frequency are different from each other.

6. A feedforward amplifier according to claim 5, said second distortion circuit further comprising a power divider wherein said power divider divides said input signal into said portion of said input signal.

7. A feedforward amplifier according to claim 6, said second distortion circuit further comprising an amplitude control and a phase control coupled in series, said phase control having an output wherein said amplitude control receives an output from said power divider and said output of said phase control is said portion of said input signal.

\* \* \* \* \*